324-77   SR
8/31/76      OR    3,978,403

United States Patent [19]
Mansfield et al.

[11] 3,978,403
[45] Aug. 31, 1976

[54] AUTOMATIC TRACKING SIGNAL ANALYZER

[75] Inventors: Richard S. Mansfield, Newbury Park; John A. McCracken; Robert J. Youngquist, both of Camarillo, all of Calif.

[73] Assignee: Minnesota Mining and Manufacturing Company, St. Paul, Minn.

[22] Filed: May 6, 1974

[21] Appl. No.: 467,407

[52] U.S. Cl. .......................... 324/77 A; 324/79 R; 324/77 B; 331/25
[51] Int. Cl.[2] .................... G01R 23/16; H03B 3/08
[58] Field of Search .......... 334/30; 324/79 R, 57 H, 324/77 A, 77 B, 77 D; 179/1; 331/25, 44, 47

[56] References Cited
UNITED STATES PATENTS

| | | | |
|---|---|---|---|
| 3,310,744 | 3/1967 | Miller | 324/79 |
| 3,588,730 | 6/1971 | Schreuer | 331/25 |
| 3,611,175 | 10/1971 | Boelke | 331/25 |
| 3,621,388 | 11/1971 | Davis | 324/77 B |
| 3,716,785 | 2/1973 | Masters | 324/77 B |
| 3,805,192 | 4/1974 | Ocnaschek | 331/25 |

*Primary Examiner*—R. V. Rolinec
*Assistant Examiner*—Michael J. Tokar
*Attorney, Agent, or Firm*—Alexander, Sell, Steldt & DeLaHunt

[57] ABSTRACT

Method and apparatus for analyzing the harmonic distortion present in an input signal wherein first and second reference signals are generated differing by a small offset frequency. The first reference signal is mixed with the input signal to provide an intermediate carrier signal which is modulated with the second reference signal to provide a measurement carrier signal which in turn is modulated with the input signal to produce an output signal which is filtered to isolate a specific signal. By isolating a specific signal for each harmonic of the input signal to be analyzed, the proportion of each such harmonic is revealed as a percentage of the fundamental harmonic of the input signal.

By adding a tunable oscillator to the apparatus, it may function as a wave analyzer, in which case the specific output signal represents the magnitude of any selected component of the signal to be analyzed.

17 Claims, 12 Drawing Figures

Fig. 8 (FILTERED MULTI-DECADE DIVIDE NETWORK -59)

Fig. 9

Fig. 10   TABLE I

MODE OF OPERATION / SIGNALS

| Reference Number | Input Signal Fundamental Frequency | Mode of Operation Measured Harmonic Fundamental | Harmonic Divisor | Decade Divisor | A (MHz) | B (MHz) | C (MHz) | D (MHz) | E (MHz) | F (MHz) | G (MHz) | H (MHz) | I (MHz) | J (MHz) | K (Hz) |
|---|---|---|---|---|---|---|---|---|---|---|---|---|---|---|---|
| 34 | 1 MHz | FUND. | ÷1 | ÷1 | 1 | 11.0005 | 10.0005 | 1 | 1 | 1 | 11.0005 | 10 | 10 | 1.0005 | 500 |
| 35 | 1 MHz | 2d | ÷2 | ÷1 | 1 | 12.0005 | 10.0005 | 2 | 2 | 1 | 12.0005 | 10 | 10 | 2.0005 | 500 |
| 36 | 1 MHz | 3d | ÷3 | ÷1 | 1 | 13.0005 | 10.0005 | 3 | 3 | 1 | 13.0005 | 10 | 10 | 3.0005 | 500 |
| 37 | 10 KHz | FUND. | ÷1 | ÷1 | .01 | 10.0105 | 10.0005 | .01 | .01 | .01 |  | 10 | 10 |  |  |
| 38 | 10 KHz | FUND. | ÷1 | ÷100 | .01 | 11.0005 | 10.0005 | 1 | .01 | .01 | .110005 | 10 | .10 | .010005 | 5 |
| 39 | 100 KHz | FUND. | ÷1 | ÷10 | .1 | 11.0005 | 10.0005 | 1 | .1 | .1 | .110005 | 10 | 1 | .1005 | 50 |
| 40 | 1 KHz | FUND. | ÷1 | ÷1000 | .001 | 11.0005 | 10.0005 | 1 | .001 | .001 | .010005 | 10 | .01 | .010005 | .5 |
| 41 | 1 KHz | FUND. | ÷1 | ÷1000 | .001 | 11.005 | 10.005 | 1 | .001 | .001 | .011005 | 10 | .01 | .00005 | 5 |
| 42 | 10 KHz | FUND. | ÷1 | ÷100 | .01 | 11.005 | 10.005 | 1 | .01 | .01 | .11005 | 10 | .1 | .0105 | 50 |
| 43 | 100 KHz | FUND. | ÷1 | ÷10 | .1 | 11.005 | 10.005 | 1 | .1 | .1 | 1.1005 | 10 | 1 | .1005 | 500 |
| 44 | 1 MHz | FUND. | ÷1 | ÷1 | 1 | 11.0005 | 10.005 | 1 | 1 | 1 | 11.0005 | 10 | 10 | 1.0005 | 500 |
| 78 | .1 KHz | FUND. | ÷1 | ÷1000 | .0001 | 10.105 | 10.005 | .1 | .0001 | .0001 | .010105 | 10 | .01 | .00005 | .5 |

AUTOMATIC TRACKING SIGNAL ANALYZER

BACKGROUND OF THE INVENTION

1. Field of the Invention

This invention relates generally to electronic test equipment and more specifically to signal analyzers for measuring harmonic distortion. The invention also relates to measuring particular characteristics of an input signal such as the relative amplitudes of its fundamental and other individual harmonics.

2. Description of the Prior Art

Various analyzers have been used in the past to measure the amount of harmonic distortion present in an input signal. For example, wave analyzers which function as frequency selective volt meters have been used to measure the relative amplitude of any frequency in the passband of the wave analyzer.

In a wave analyzer a local oscillator modulates the incoming signal to provide a summation or difference frequency the voltage of which is measured to provide an indication of signal magnitude. Using a wave analyzer, the fundamental frequency of the input signal can be determined and the magnitude of this frequency component can be measured. By doubling or tripling the fundamental frequency in the local oscillator of the wave analyzer, the magnitude of the respective second or third harmonic in the input signal can be measured. In some wave analyzers, the sensitivity of the meter has been adjustable to provide a full scale or 100 per cent reading for the magnitude of the fundamental frequency. This has enabled the meter to be calibrated to provide a percentage indication of the amount of distortion associated with a particular harmonic component.

Distortion analyzers have also been used to measure the amount of total harmonic distortion plus noise which is present in an input signal. In a distortion analyzer, the magnitude of the fundamental frequency is not measured since this frequency is rejected. Although the distortion analyzer measures the total harmonic distortion present in a signal, it does not provide an indication of the amount of distortion caused by a particular harmonic component. In many cases, adjustments needed to compensate for second harmonic distortion are different than those needed to compensate for third harmonic distortion. Since the distortion analyzers have not been capable of distinguishing these harmonics, they have not performed satisfactorily under these circumstances.

A wave analyzer is typically used in conjunction with other types of electronic measurement apparatus to determine the amount of harmonic distortion produced by a test unit, such as a magnetic recorder. Such a combination of measurement apparatus would typically include a main oscillator and a voltmeter connected to the input of the recorder, and a counter and wave analyzer connected to the output of the recorder.

After the recorder has been set up and its output level adjusted to some reference point characteristic of that recorder, the wave analyzer is calibrated to the full scale reading at that level. The wave analyzer is initially manually adjusted to provide a maximum output signal at a particular frequency. This has been the method for determining the magnitude of fundamental frequency components of the input signal. In some cases, the counter has been used to provide an estimate of the fundamental frequency. Although this has reduced the time needed to locate the exact fundamental frequency the manual procedure for locating the exact fundamental frequency has been quite time consuming.

After the fundamental frequency has been determined, the wave analyzer can then be tuned to the particular harmonic frequency whose magnitude is to be measured. By adjusting the sensitivity of the wave analyzer's meter, a reading of the harmonic frequency has provided a measure of the percentage of distortion.

In some apparatus, the main oscillator, the wave analyzer, and the voltmeter are provided in a single unit. A separate switch is used so that the voltmeter can measure the magnitude of both the signal provided by the main oscillator and the signal provided at the output of the test unit.

In some devices the tuning capacitors of the main oscillator are ganged with the tuning capacitors of the local oscillator in the wave analyzer. In this combination, the manual tuning of the main oscillator also results in the manual tuning of the local oscillator of the wave analyzer.

The use of any of these apparatus to test a unit such as a recorder has been time consuming even to provide an initial indication of the amount of distortion present in a signal. They have been particularly unsatisfactory if the degree of that distortion has been greater than desired, typically one per cent of the fundamental frequency. Under these circumstances, it has been desirable to adjust the record level of the recorder and also to readjust the reproduce level of the recorder to provide the original output level. Unfortunately, the readjustment of the reproduce level changes the level of the fundamental frequency as well as the level of all the harmonic components of the input signal. As a consequence, the fundamental frequency must be relocated to recalibrate the wave analyzer to a particular signal level. Only after recalibration can the wave analyzer be used to remeasure the percentage of harmonic distortion. In some cases the record level must be subsequently readjusted so that this cumbersome procedure must be repeated several times.

SUMMARY OF THE INVENTION

The present signal analyzer automatically tracks the frequency of the input signal and automatically measures the per cent of distortion appearing at a selected harmonic frequency. Since the frequency of the incoming signal is automatically tracked, the distortion can be measured even if this frequency varies. When used to measure the distortion produced by a test unit, such as a recorder, this makes it possible to vary the record current and simultaneously determine the amount of the distortion. The device need not be recalibrated with each variation of the record current. The present signal analyzer can be switched to measure the distortion associated with a particular one of the harmonics to facilitate those adjustments which are associated with only one of the particular harmonics.

The passband of the present analyzer is divided into a plurality of frequency ranges. A range selection network provides a signal with characteristics indicative of the particular frequency range which includes the fundamental frequency of the input signal. This selection signal is used to maintain the frequency of the signals throughout the analyzer within a preferred operating range and also to adjust the passband of various low pass filters.

The apparatus includes a first loop which is responsive to the input signal to provide an intermediate carrier signal having a frequency dependent upon the frequency of the input signal and a first reference signal. This loop functions as a frequency lock loop to maintain a known relationship between the frequency of the intermediate carrier signal and the input frequency.

In the first loop, a first balanced modulator modulates the intermediate carrier signal with said first reference signal which has a frequency equal to a reference frequency plus an offset frequency. The signal from the balanced modulator is compared in a phase detector with the frequency of the input signal. The output of the phase detector controls an oscillator which provides the intermediate carrier signal.

In a second loop, the intermediate carrier signal is modulated in a second balanced modulator with a second reference signal of said reference frequency. The output of the second balanced modulator is introduced through an appropriate low pass filter to provide a measurement carrier signal which is introduced to a third balanced modulator along with the input signal. In the third balanced modulator, the particular harmonic to be measured is demodulated by the measurement carrier. The resulting output signal is passed through a low pass filter to select a specific output signal whose magnitude is dependent upon the magnitude of the particular harmonic.

To maintain the desired separation of the frequencies of the intermediate carrier signal and the first reference signal, a decade divide network responsive to the output of the range selection network can be used to reduce the frequency of the signal from the first balanced modulator. Similar decade divide networks can be provided in the second loop to provide a corresponding division in the signals therein.

An automatic gain control amplifier in the input circuit of the analyzer normalizes the input signal so that distortion measurements can be made not only with frequency variations but also with variations in the amplitude in the input signal. The signal analyzer can also be adapted to function as a wave analyzer.

The invention also relates to methods of analyzing an input signal to determine particular characteristics such as the relative amplitudes of the fundamental frequency and other individual harmonics in the input signal.

These and other features and advantages of the present invention will become more apparent with a description of preferred embodiments taken in conjunction with the associated drawings.

DESCRIPTION OF PREFERRED EMBODIMENTS

Figure 1:
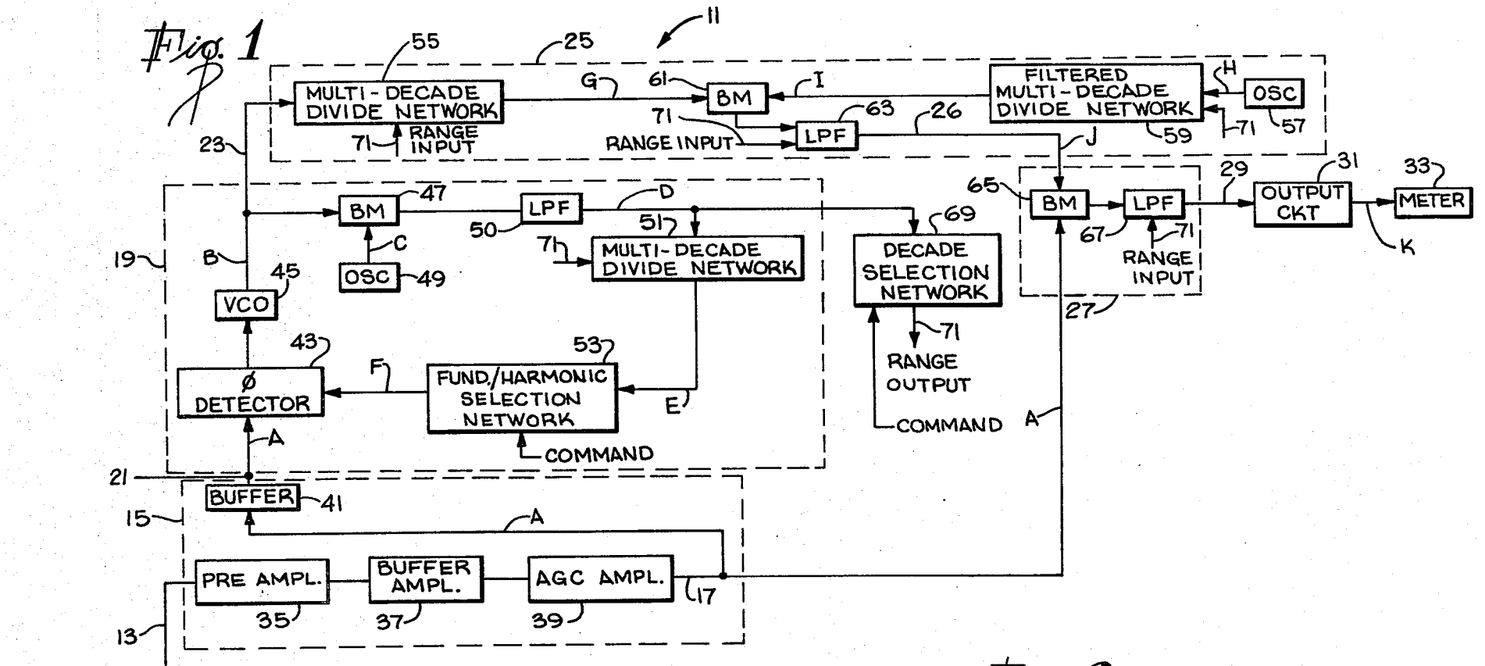
FIG. 1 is a block diagram of one embodiment of the signal analyzer of the present invention including a reference osillator, a decade selection network, a plurality of multi-decade divide networks, and a plurality of low pass filters.

A preferred embodiment of the signal analyzer of the present invention is illustrated in the block diagram of FIG. 1 and designated by the reference numeral 11. The analyzer 11 is responsive to an input signal on a conductor 13 to provide at its output a metered indication of the amount of harmonic distortion present in the input signal. The input signal will typically have a fundamental frequency within the range of 100 Hertz (Hz) to 1 MegaHertz (MHz). The input signal will also have varying degrees of second and third harmonic distortion which can be individually measured by the analyzer 11.

The analyzer 11 includes input circuits 15 which receive the input signal on the conductor 13 and provide a normalized input signal on a conductor 17. This normalized input signal is buffered and introduced to a frequency tracking network 19 through a conductor 21. The frequency tracking network 19, which may have the configuration of a first loop, provides an intermediate carrier signal on a conductor 23 which has a known frequency relationship with the input signal on the conductor 13.

A carrier network 25 is responsive to the intermediate carrier signal on the conductor 23 to provide a measurement carrier signal on a conductor 26. A demodulation network 27 is responsive to the normalized input signal on the conductor 17 and the measurement carrier signal on the conductor 26 to provide a specific output signal on a conductor 29. The specific output signal has a magnitude proportional to the magnitude of the fundamental frequency or a particular harmonic of the fundamental frequency of the input signal. The specific output signal on the conductor 29 is introduced to a meter 33 through output circuits 31 which typically include conventional amplifiers and a rectifier. The meter 33 can be calibrated to provide a percentage indication of the magnitude of a particular harmonic frequency compared to the magnitude of the fundamental frequency of the input signal. In this particular embodiment of the analyzer 11, the carrier network 25, the demodulation network 27, and a portion of the frequency tracking network 19 form a second loop.

In a further description of this preferred embodiment, it will be of advantage to discuss the structure and features of the analyzer 11 with reference to input signals having specific fundamental frequencies. Other signals throughout the analyzer 11 will be designated with capital letters and their characteristics in response to the specific fundamental frequencies of the input signal will be tabulated in the columns of Table I, shown in FIG. 10. The rows of Table I will be listed in the first column of the Table. The specific fundamental frequency of the input signal will appear in the second column of Table I. In the third, fourth and fifth columns, the mode of operation of the analyzer 11 will be set forth. In the third column the specific fundamental or harmonic frequency to be measured by the analyzer 11 will be listed. In the fourth and fifth columns, respective harmonic and decade divisors, which will be discussed in greater detail below, will be tabulated for a specific mode of operation. The remaining columns of Table I will show the specific frequency of the lettered signals throughout the analyzer 11 in response to the specific fundamental frequency of the input signal and the particular mode of operation.

The specific embodiment illustrated in FIG. 1 is designed to analyze input signals having a fundamental frequency in the range between 100 Hz and 1 MHz. It will be obvious to those skilled in the art that the invention can be otherwise embodied to accommodate frequencies outside this range.

It will be initially assumed that the fundamental frequency of the input signal is 1 MHz. This input signal will also contain a frequency component of 2 MHz corresponding to the second harmonic, and a frequency component of 3 MHz corresponding to the third harmonic. This input signal is introduced on the conductor 13 to the input circuits 15 which may include a preamplifier 35 and a buffer amplifier 37 having a gain such as ten. An amplifier 39 automatically controls the gain of the signal from the amplifier 37 so that analysis of the input signal can be made even with variations in the magnitude of the input signal. At the output of the amplifier 39, the normalized input signal, hereinafter referred to as the signal A, is provided on the conductor 17.

Figure 10:
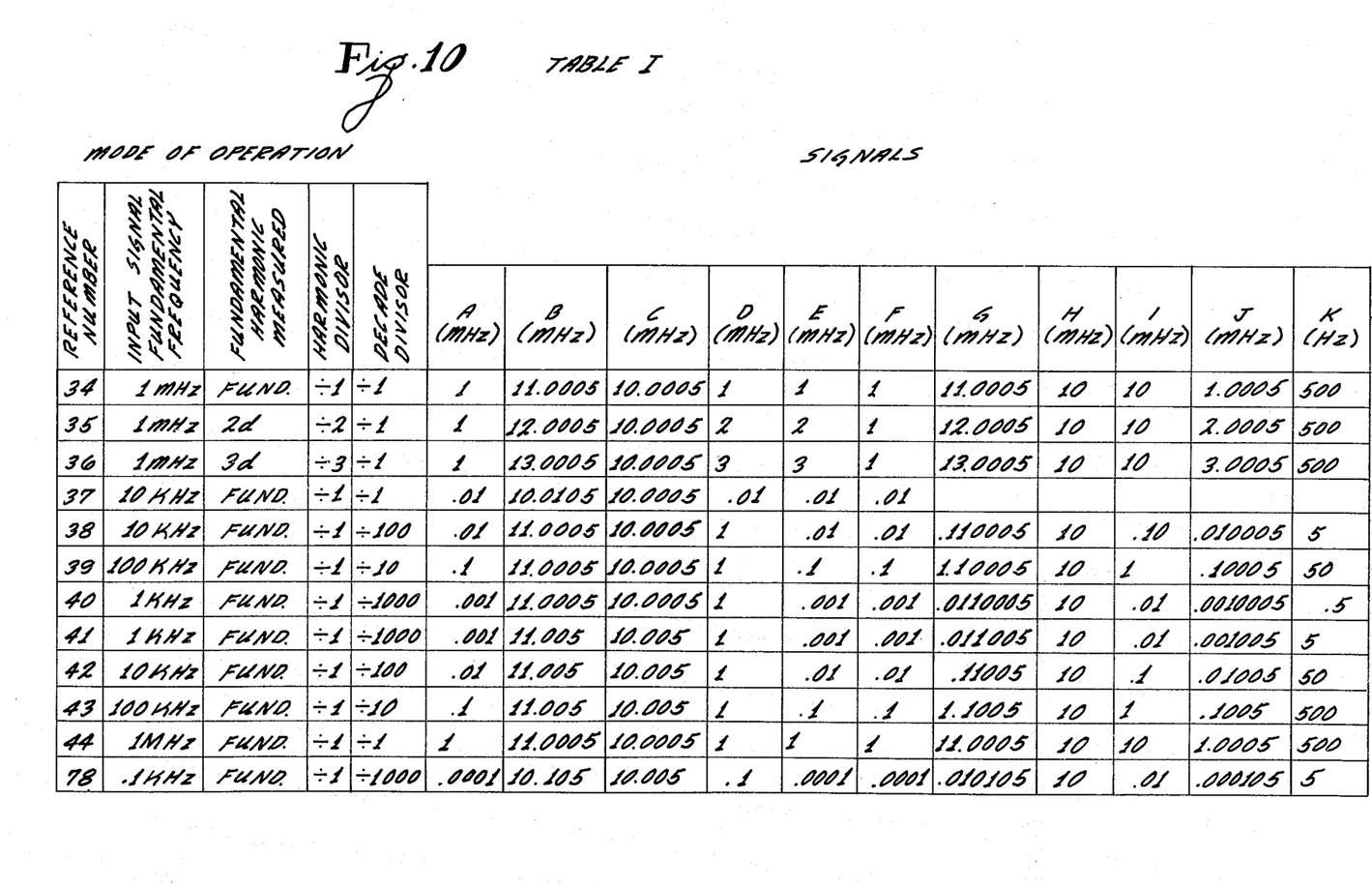
FIG. 10 is a table showing frequencies of signals at strategic terminals in the system of FIG. 1 for sets of individual conditions.

In this embodiment of the analyzer 11, the signal A has the same frequency characteristics as the input signal. Therefore in row 34 of Table I, the signal A is tabulated to have a fundamental frequency of 1 MHz. The signal A is introduced through a buffer 41 in the input circuits 15 to the conductor 21. The buffer 41 provides isolation between the input circuits 15 and the frequency tracking network 19.

In the frequency tracking network 19, the signal A is introduced to a phase detector 43 which forms a part of the first loop. The output of the phase detector 43 controls a voltage controlled oscillator 45 which provides an intermediate carrier signal of initially variable frequency hereinafter referred to as the signal B. The signal B can be introduced to a first balanced modulator along with a first reference signal C received from a reference oscillator 49. In this embodiment, the signal C has a frequency equal to the sum of a reference frequency, such as 10 MHz, and an offset frequency such as 500 Hz. Thus, in row 34 of Table I, the signal C is tabulated to have a frequency of 10.0005 MHz. The oscillator 49 can be adjusted in a manner to be described to provide for slight variations in the offset frequency. The output of the balanced modulator 47 is introduced to a low pass filter 50 to provide a signal D which has a frequency substantially equal to the difference between the frequencies of the signals B and C. The low pass filter 50 in this embodiment of the analyzer 11 has a passband of 5 MHz.

The balanced modulator 47 can be described generally as a modulator responsive to a first signal and a second signal each having a particular frequency. At the output of a balanced modulator, signals are provided which have frequencies equal to the sum and difference of the frequencies of the first and second signals. As opposed to other types of modulators, a balanced modulator does not provide at its output signals having frequencies equal to those of the first signal and the second signal. Typically, a balanced modulator, such as the modulator 47, will be followed by a filter, such as the filter 50, which passes one or the other of the signals having the sum or difference frequency. In this particular embodiment, the filter 50 is a low pass filter so that the balanced modulator 47 and the filter 50 combine to provide means for producing a signal having a frequency equal to the difference between the frequency of the first signal and the frequency of the second signal.

The signal D can be introduced through a first multi-decade divide network 51 which can be controlled to divide the frequency of the signal D by a decade divisor such as 1, 10, 100, or 1000, to provide a signal E. It is these decade divisors which are tabulated in the fifth column of Table I. The multi-decade divide network 51 will be discussed in greater detail below.

The signal E can be introduced to a fundamental/harmonic selection network 53 which divides the frequency of the signal E by a harmonic divisor such as 1, 2, or 3, dependent upon which of the fundamental or particular harmonic frequencies is to be measured. It is these harmonic divisors which are tabulated in the fourth column of Table I. A feedback signal F provided at the output of the network 53 is introduced to the phase detector 43 to complete the first loop.

It is the purpose of the first loop to provide a frequency lock such that the signal B has frequency characteristics with a known relationship to the particular harmonic of the input signal to be measured. This frequency lock is accomplished primarily at the phase detector 43 wherein the frequency of the signal A is compared with the frequency of the signal F. If the frequency of the signal A is greater than the frequency of the signal F, the detector 43 increases the frequency of the signal B at the output of the oscillator 45. Conversely, if the frequency of the signal F is greater than the frequency of A, the frequency of the signal B is decreased.

It can be appreciated that in a frequency lock state, the frequency of the signal F and the frequency of the signal A will be equal. Furthermore, if the characteristics being measured are those of the fundamental frequency, in which case the networks 51 and 53 both divide by unity, the signals D and E will also have the frequency of the signal A. For these reasons, the signals D, E and F in row 34 of Table I are each shown to have frequencies of 1 MHz.

In a particular embodiment, signal C has a frequency of 10.0005 MHz. In order to provide the signal D with a difference frequency of 1 MHz, it follows that the intermediate carrier signal B must have a frequency of 11.0005 MHz. These frequencies are also tabulated in Table I.

In the carrier network 25 the signal B on the conductor 23 is introduced to a second multi-decade divide network 55 similar to the network 51. For this mode of operation, it will be assumed that the network 55 divides the frequency of the signal E by unity to provide at its output a signal G having a frequency 11.0005 MHz.

The carrier network 25 also includes an oscillator 57 which provides a second reference signal H having a frequency equal to the reference frequency in the signal C. The signal H is introduced to a filtered third multi-decade divide network 59 which provides at its output signal I and is similar to the networks 51 and 55, except the signal I is filtered in a manner to be described in greater detail below. For this particular mode of operation, it will be assumed that the network 59 divides the frequency of the signal H by unity so that the signal I has a frequency of 10 MHz as tabulated in row 34 of Table I.

The signals G and I are introduced to a second balanced modulator 61 similar to the modulator 47. The output of the balanced modulator 61 is introduced through a low pass filter 63 which has a passband variable in a manner to be described. For this particular embodiment and mode of operation, the filter 63 has a passband of 3 MHz so that the only modulated signal passed by the filter 63 is that having the difference frequency 1.0005 MHz. This signal, introduced on the conductor 26, will be hereinafter referred to as the measurement carrier signal J.

In the demodulation network 27, a third balanced modulator 65, similar to the modulators 47 and 61, is responsive to the normalized input signal A and the measurement carrier signal J to provide an output signal having sum and difference frequencies. This output signal will include a signal having the difference frequency of 500 Hz resulting from the demodulation of the fundamental frequency of the signal A (1 MHz) and the frequency of the measurement carrier J (1.0005 MHz). The output signal is introduced to a low pass filter 67 which has a passband such that the only signal passed is the 500 Hz signal. The specific signal emanating from the low pass filter 67 to the conductor 29 and to the output circuits 31 is hereinafter referred to as the K.

The magnitude of the signal K is proportional to the magnitude of the particular fundamental or harmonic frequency measured by the analyzer 11. As previously noted, the meter 33 can be calibrated to provide a visual indication magnitude of the particular harmonic frequency being measured as a percentage of the magnitude of the fundamental frequency. In the preceding discussion wherein the characteristics of the fundamental frequency were measured, the meter 33 would provide a 100 per cent or full scale reading.

It is desirable to provide the intermediate carrier signal B with high frequency characteristics which are indicative of the particular fundamental or harmonic, the distortion of which is to be measured by the analyzer 11. Then, in response to the signal B, the network 25 can provide the measurement carrier signal with the frequency characteristics needed to demodulate the fundamental or harmonic frequency of the signal A. In a preferred embodiment, these frequency characteristics in the signal B are provided by manually commanding the selection network 53 to divide by 1 if the magnitude of fundamental frequency is to be measured, to divide by two if the magnitude of the second harmonic frequency to be measured, or to divide by three if the magnitude of the third harmonic frequency is to be measured. If it is desirable to measure the distortion of other harmonics in the input signal, the selection network 53 can be provided with characteristics for dividing by other corresponding integers.

If it is again assumed that the input signal has a fundamental frequency of 1 MHz, but the magnitude of the second harmonic frequency is to be measured, the resulting frequencies of the signals A to K can be those tabulated in a row 35 of Table I. In this case, the frequency of the signal F will be one-half of that of the signal E, since the network 53 will have been commanded to divide by 2. In a frequency lock state, the frequency of the signal B will be 12.0005 MHz. Note that this frequency differs from that of the signal B when the magnitude of the fundamental frequency was measured as shown in row 34 of Table I.

It will be further noted that the mode of operation corresponding to row 35 of Table I provides the measurement carrier signal J with a frequency of 2.0005 MHz. When this signal J is used to demodulate the complex input signal A, the second harmonic in the input signal A having a frequency of 2 MHz is demodulated to provide a signal having a frequency of 500 Hz. Of course other signals will be produced by the demodulation of the fundamental and third harmonic frequencies. These signals will both have frequencies of 1.0005 MHz.

The low pass filter 67 can be provided with a passband such that only the specific output signal having the frequency 500 Hz is passed to the conductor 29. Since this difference frequency is generated by the second harmonic in the input signal A when mixed with the signal J from the filter 63, its magnitude corresponds to the magnitude of the second harmonic. If the meter 33 was calibrated to provide a 100 per cent or full scale reading when the magnitude of the fundamental frequency was measured, the meter reading corresponding to the conditions of row 35 of Table I will provide a percentage indication of the amount of second harmonic distortion present in the input signal A.

In a mode of operation tabulated in row 36 of Table I, the fundamental frequency of the input signal is again assumed to be 1 MHz. If it is desired to measure the amount of third harmonic distortion present in the input signal, the selection network 53 can be set to provide a harmonic divisor of three. Under these conditions, the frequencies of the signals A to K can be then tabulated along the row 36. It will be noted in particular that the frequency of the measurement carrier signal J is 3.0005 MHz. This frequency will demodulate the third harmonic in the signal A to provide the 500 Hz difference signal K. The magnitude of this signal K is then indicative of the amount of third harmonic distortion present in the signal A.

If the fundamental frequency of the input signal is changed to 10 KHz and the mode of operation includes the conditions tabulated in row 37 of Table I, the particular signal B will have a frequency of 10.0105 MHz. Of particular interest are the frequencies of the signals B and C which under these conditions differ by only 10 KHz. It has been found that when the signals B and C differ in frequency by about 10 KHz or less, the frequency tracking network 19 tends to "hunt" for the locked condition. In other words, with a separation of only approximately 10 KHz between the frequencies of the signals B and C, the network 19 will tend to oscillate in and out of the lock condition. For this reason, it is desirable to maintain this frequency separation above 10 KHz. In a preferred embodiment, this frequency separation is maintained above 100 KHz to provide a 90 KHz guard band.

In a preferred embodiment this frequency separation of the signals B and C is provided by dividing the fundamental frequency of the input signal into the following frequency range which will be referred to hereinafter as the first, second, third and fourth frequency ranges, respectively:

| | |
|---|---|
| .1 KHz to 1 KHz | [1st Frequency Range (× 10²)] |
| 1 KHz to 10 KHz | [2nd Frequency Range (× 10³)] |
| 10 KHz to 100 KHz | [3rd Frequency Range (× 10⁴)] |
| 100 KHz to 1 MHz | [4th Frequency Range (× 10⁵)] |

A decade selection network 69 is responsive to the signal D in the frequency tracking network 19 to provide a range output signal on a plurality of conductors collectively illustrated and designated by the reference numeral 71. This range output signal has characteristics indicative of the particular frequency range which includes the fundamental frequency of the input signal. The decade selection network 69 will be described in greater detail below.

In this particular embodiment, the multi-decade divide network 51 is responsive to the range output signals on the conductors 71 to divide the signal D by 1, 10, 100, or 1000, depending upon the frequency range which includes the fundamental frequency of the input signal. Thus, if the fundamental frequency is included in the first frequency range, the network 51 divides the signal D by 1000. For fundamental frequencies in the second frequency range, the signal D is divided by 100. Similarly, decade divisors of 10 and 1 are associated with the third and fourth frequency ranges, respectively. These decade divisors are tabulated in the fifth column of Table I.

Referring now to row 38 of Table I, it will be noted that a decade divisor of 100 for the 10 KHz signal provides a separation between the frequencies of the signals B and C of 1 MHz. With the magnitude of this frequency separation greater than 100 KHz, the frequency tracking network 19 can provide a positive lock when the frequency of the signal A is equal to the frequency of the signal F.

In the second loop of the analyzer 11, the multi-decade divide network 55 is responsive to the range output signals on the conductors 71 to divide the frequency of the signal B by decade divisors which differ for each of the frequency ranges. In this preferred embodiment, the decade divisors in the network 55 are the same as those for the network 51 in each of the frequency ranges. Thus for the 10 KHz signal tabulated in row 38 of Table I, the signal G will be equal to the signal B, divided by 100. Ultimately this will provide the output signal K with a frequency of 5 Hz.

As shown in row 39 of Table I, an input signal with a fundamental frequency of 100 KHz and a decade divisor of 10 will provide the output signal K with a frequency of 50 Hz.

It is particularly interesting to follow this progression into the first frequency range where a signal of 1 KHz will correspond to a decade divisor of 1000. Reference to row 40 of Table I will show that if the offset frequency in the signal C is maintained at 500 Hz, this mode of operation will provide the output signal K with a frequency of only .5 Hz. Since this frequency is very difficult to measure, it may be desirable to increase the offset frequency for the input signal in this particular frequency range. For example, the offset frequency can be increased to 5000 Hz when the fundamental frequency of the input signal is within the first frequency range. In this mode of operation, an input signal with a fundamental frequency of 1 KHz would provide the output signal K with a frequency of 5 Hz as tabulated in row 41 of Table I. Thus, in this embodiment the frequency of the signal K is 5 Hz for both the first and second frequency ranges, 50 Hz for the third frequency range, and 500 Hz for the fourth frequency range.

In general, it is desirable to maintain the output signal K at a frequency, such as 500 Hz, low enough so that the low pass filter 67 can separate the output signal K from the other signals provided by the balanced modulator 65. It is also desirable that the output signal K have a frequency, such as 5 Hz, high enough that it can be effectively measured in the output circuits 31.

In another preferred embodiment of the invention, the frequency of the output signal K is maintained within the desired range from 5 to 500 Hz by adjusting the offset frequency of the signal C in the fourth range rather than the first range of frequencies. In such an embodiment, the offset frequency in the signal C is maintained at 5000 Hz for each of the first, second and third frequency ranges and is reduced to 500 Hz for the fourth frequency range. In rows 42, 43 and 44 of Table I, the frequencies of 10 KHz, 100 KHz, and 1 MHz are tabulated with these corresponding offset frequencies to provide the output signal K with the frequencies of 50 Hz, 500 Hz and 500 Hz respectively. These frequencies of the output signal K are preferred for the corresponding frequency ranges since the 500 Hz signal, rather than the 5 Hz signal which is more difficult to measure, appears in two of the four frequency ranges.

Figure 2:
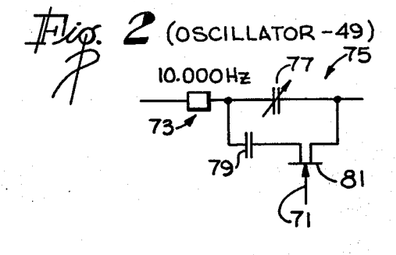
FIG. 2 is a schematic of one embodiment of the reference oscillator illustrated in FIG. 1.

The adjustment of the offset frequency can be accomplished with the oscillator 49 shown in FIG. 2. A crystal shown generally at 73 having a frequency corresponding to the reference frequency of the signal C, such as 10 MHz, is connected in series with a capacitance 75 which is variable to pull the frequency of the crystal 73 a small percentage. In this embodiment, the capacitance 75 includes a variable trimming capacitor 77 which is connected in shunt with the serial combination of a capacitor 79 and field effect transistor 81. The transistor 81 is responsive to the range output signals on the conductors 71 to increase or decrease the capacitance 75 in the oscillator 49.

The capacitor 77 is tuned to provide the oscillator 49 with the primary offset frequency, that frequency which is used with the greatest number of frequency ranges. The capacitor 79 is either added or substracted from the circuit of the oscillator 49, to either increase or decrease the capacitance 75. This provides the oscillator 49 with the secondary offset frequency; that frequency which is used with the least number of frequency ranges. In the first mentioned embodiment, the primary offset frequency of 500 Hz was maintained for the second, third, and fourth frequency ranges. In that embodiment, the addition of the capacitor 79 in response to detection of the first frequency range increases the capacitance 75 to pull the frequency of the crystal 73 to the secondary offset frequency of 5000 Hz.

In the second mentioned embodiment, the primary frequency of 5000 Hz was maintained for the first, second, and third frequency ranges. In that embodiment, the deletion of the capacitor 79 from the circuit of the oscillator 49 in response to the detection of the fourth frequency range decreases the capacitance 75 so that the crystal 73 provides the secondary frequency of 500 Hz.

Frequencies relating to the measurement of second and third harmonics in the signals tabulated in rows 37 to 44 can be derived in the manner described with reference to rows 35 and 36 of Table I.

In Table I only the frequencies at the top of the frequency ranges have been tabulated in order to illustrate the effect of variations in the divide networks 51, 55, 59 and the fundamental/harmonic selection network 53. From this tabulation it might appear that in a given frequency range a particular signal may have only one discreet value. For example, it might appear that only the signal D will have a frequency of either 1, 2 or 3 MHz throughout the entire range of the analyzer 11. In reality, the frequencies of most of the signals will vary considerably within a given frequency range. For example, at the lower end of the first frequency range, an input signal having a frequency of .1 KHz will be divided by the same decade divider as that of the 1 KHz signal tabulated in row 41. For comparison, frequencies resulting from this .1 KHz input signal are tabulated in a row designated by the reference numeral 78. In particular it will be noted that the signal D has a frequency of .1 MHz or 100 KHz. In this particular embodiment, this is the least separation between the frequencies of the signals B and C. Thus a 90 KHz guard band is provided between the 100 KHz frequency and the 10 KHz frequency at which the tracking network 19 starts to hunt or oscillate. It follows from this illustration that the signal D in this particular embodiment will have a frequency in a range between 100 KHz at the low end of each frequency range when the fundamental is being measured, and 3 MHz at the high end of each frequency range when the third harmonic is being measured.

Figures 3, 3A, 3B, 4:
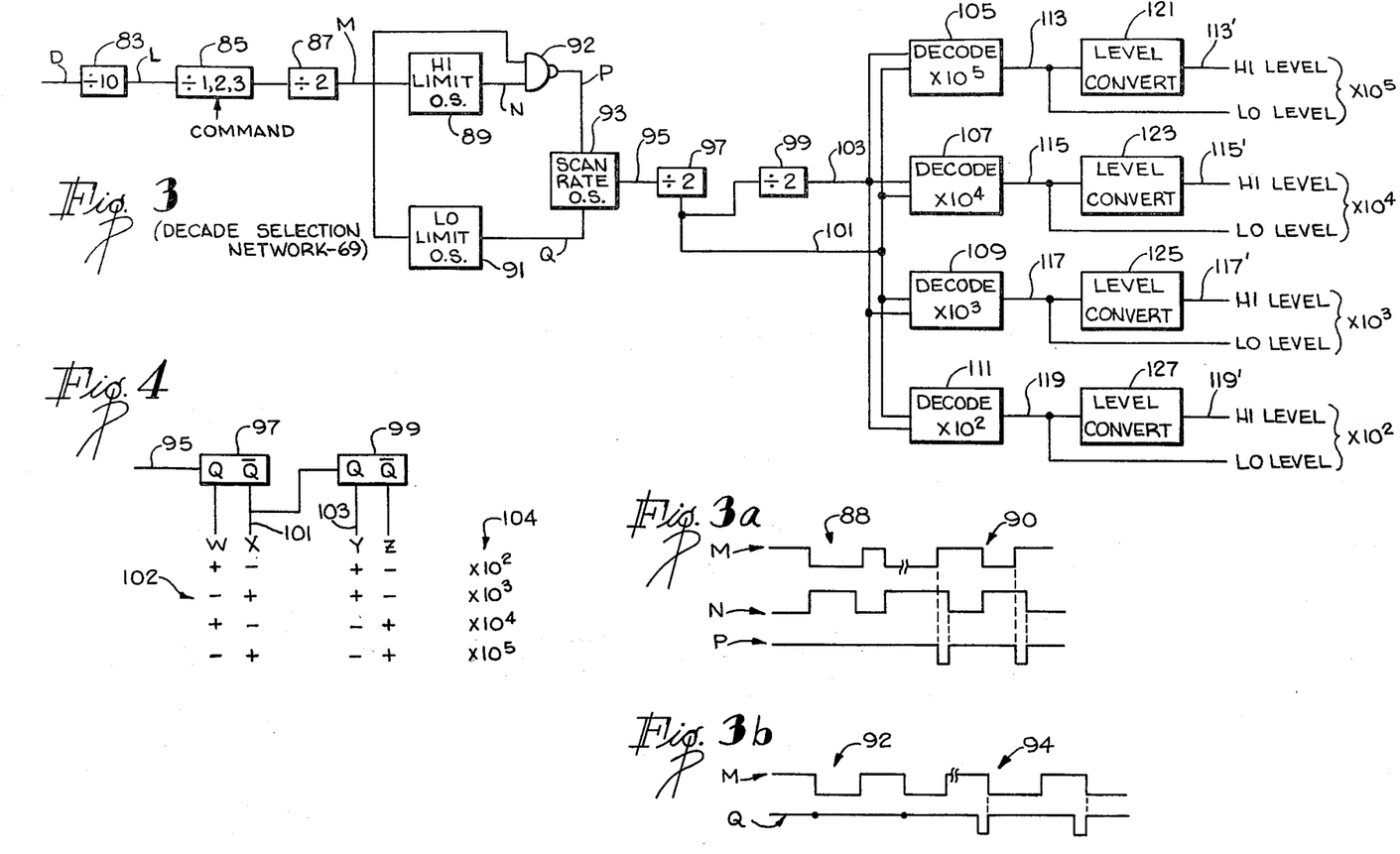
FIG. 3 is a block diagram of one embodiment of the decade selection network illustrated in FIG. 1 and including a high limit one shot, a low limit one shot, and a pair of divide networks which combine to provide coded signals indicative of a plurality of frequency ranges.
FIG. 3A is a plurality of waveforms illustrating the function of the high limit one shots shown in FIG. 3.
FIG. 3B is a plurality of waveforms illustrating the function of the low limit one shots shown in FIG. 3.
FIG. 4 is a block diagram of the divide networks illustrated in FIG. 3 showing a preferred code for the frequency ranges.

The decade selection network 69, which is shown in greater detail in FIG. 3, is of particular advantage to the present invention since it automatically determines the particular frequency range which includes the fundamental frequency of the input signal. This determination makes it possible to provide several desirable adjustments throughout the analyzer 11.

As noted, the signal D at the input to the decade selection network 69 will have a frequency in a range between 100 KHz and 3 MHz. This signal can be introduced to a frequency division network 83, which lowers this frequency range by one decade. A signal L at the output of the network 83 would then have a frequency range of 10 KHz to 300 KHz. This signal can be introduced to a frequency division network 85 similar to the selection network 53 in the first loop. This network 85 will divide the frequency of the signal L by 1, 2 or 3 if the amplitude of the fundamental, second harmonic, or third harmonic frequency respectively, is being measured.

To insure that the frequency of the signal L is divided by an even number so that symmetry can be maintained, the signal at the output of the network 85 can be further divided by 2 in a network 87. A signal M at the output of the network 87 will have a frequency between 5 KHz and 50 KHz. This signal M can be introduced to both a high limit one shot 89 and a low limit one shot 91. If the frequency of the signal M is greater than 50 KHz, the high limit one shot 89 will activate a scan rate one shot 93; if the frequency of the signal M is less than 5 KHz, the low limit one shot 91 will activate the scan rate one shot 93. Following activation by either of the one shots 89 or 91, the scan rate one shot 93 will cause the frequency ranges of the input signal to be scanned to determine which of the ranges includes the fundamental frequency of the input signal. In a preferred embodiment, the timing period of the scan rate one shot is set to .5 seconds so that two of the frequency ranges can be scanned in the period of 1 second.

In FIG. 3A, the signal M is plotted in time relationship with a signal N provided at the output of the high limit one shot 89. The signal N goes from a low to a high state in response to each of the negative going edges of the signal M. The one shot 89 maintains the signal N in the high state for a period of time (shown by the distance $d$) corresponding to a frequency of 50 KHz.

The signal M illustrated in FIG. 3A is characterized by a first portion shown generally at 88 and a second portion shown generally at 90. The first portion 88 of the signal M has a frequency less than 50 KHz while the second portion 90 of the signal M has a frequency greater than 50 KHz. Under these circumstances, the positive going edge of the portion 88 will follow in time the negative going edge of the signal M. In the portion 90 of the signal M, however, the positive going edge of the signal M will precede the negative going edge of the signal M. If both the signals M and N are introduced to a NAND gate 92, the output of the NAND gate 92 will provide a signal P which is defined by a plurality of pluses during the time corresponding to the portion 90 of the signal M. It is these pluses in the signal P which can be used to activate the scan rate one shot 93.

In FIG. 3B, the signal M is also plotted. This signal M includes portions 92 corresponding to a frequency greater than 5 KHz and a portion 94 corresponding to a frequency less than 5 KHz. In this embodiment of the invention, the one shot 91 is a retriggerable one shot which can be maintained in a high state if its timing period is greater than that corresponding to the frequency of 5 KHz. Under these circumstances, a negative going edge in the M signal will occur frequently enough to maintain in a high state a signal Q at the output of the one shot 91. If the frequency of the signal M falls below 5 KHz as shown by the portions 94, the retriggerable one shot 91 will time out and fall to a negative state before it is retriggered by the next negative going edge in the signal M. This will produce a pluse in the signal Q during the times corresponding to the portions 94 of the signal M.

In response to a pulse in either the signal P or the signal Q, the scan rate one shot 93 provides a signal on a conductor 95 which can be used to clock a first divide-by-two network or flip-flop 97. The output of the flip-flop 97 can be used to clock a second flip-flop 99. The flip-flops 97 and 99 provide output signals on a pair of conductors 101 and 103, respectively, which in combination define four separate logic states. These logic states are each decoded in four decode networks designated in FIG. 3 by the consecutive odd numerals between 105 and 111. In response to an associated one of the logic states, each of the networks 105–111 provides an output signal on a respective output conductor 113–119. The signals on the conductors 113–119 may be low level signals having an output level from 0 to 5 volts. The conductors 113–119 are collectively designated in FIG. 1 by the reference numeral 71 at the low pass filters 63 and 67.

The signals on the conductors 113–119 can be introduced through a plurality of low level converters respectively designated by the consecutive odd numerals between 121 and 127. On a plurality of conductors 113'–119' at the outputs of the respective level converters 121–127, high level signals occur which may vary between −12 volts and +12 volts. These high level signals are particularly desirable for driving analogue gates so that the associated conductors 113'–119' are collectively designated in FIG. 1 by the reference numeral 71 at the divide networks 51, 55, and 59.

The flip-flops 97 and 99 are shown in greater detail in FIG. 4. Each of these flip-flops 97 and 99 has two output signals such as those labeled W and X corresponding to the flip-flop 97 and those labeled Y and Z corresponding to the flip-flop 99. As well known by those skilled in the art, the signals W, X, Y and Z will have individual logic characteristics which in combination define the four logic states shown at 102 in FIG. 4. In this preferred embodiment, each of the four logic states 102 corresponds to one of the four frequency ranges such as those shown at 104 in FIG. 4. By monitoring at least one of the signals W, X and one of the signals Y, Z, the decode networks 105 - 111 can determine which of the frequency ranges includes the fundamental frequency of the input signal. The associated decode network 105–111 will provide its high and low level output signals on the associated pairs of conductors 113–119.

Figure 5:
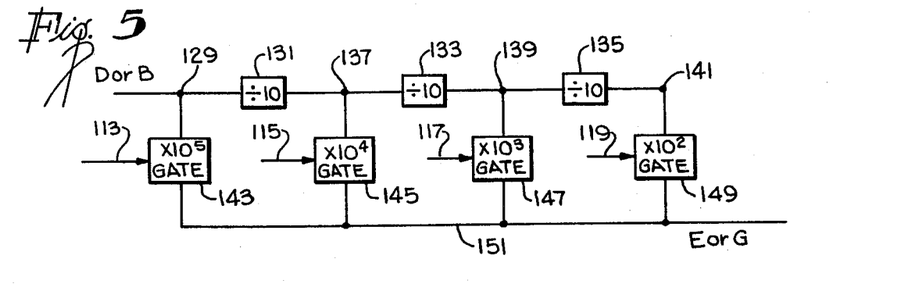
FIG. 5 is a block diagram of a preferred embodiment of the multi-decade divide networks illustrated in FIG. 1.

The divide network 51, 55 and 59 can be of the type illustrated in FIG. 5 wherein the signal D or the signal B is introduced to a terminal 129. The signal on the terminal 129 is introduced through a plurality of divide networks 131, 133 and 135 which are serially connected and have at their respective outputs the terminals 137, 139 and 141. In this embodiment, each of the divide networks 131, 133 and 135 reduces the frequency of the signal at its respective input by a magnitude of 10. A plurality of gates 143, 145, 147 and 149 are connected from the respective terminals 129, 137, 139 and 141 to a common conductor 151. In the preferred embodiment, the gates 143 through 149 are activated by the low level signals on the conductors 113–119, respectively, from the decade selection network 69. Thus, if the fundamental frequency of the output signal is in the second frequency range for example, a signal on the conductor 117 will activate the gate 147 and the signal B or D will be divided by 100 prior to its introduction onto the conductor 151. Similarly, the signals B or D can be reduced by a magnitude of 10 or 1000 if the range signals occur on the conductors 115 or 119, respectively.

Figure 6:
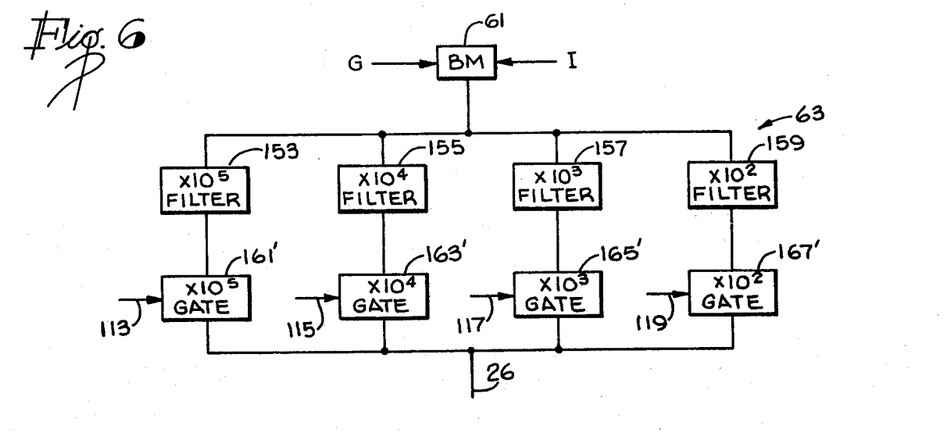
FIG. 6 is a block diagram of one of the low pass filters illustrated in FIG. 1.

The balanced modulator 61 and the associated low pass filter 63 are illustrated in FIG. 6. Since the desired frequency of the measurement carrier signal J will vary depending upon the particular frequency range and harmonic being measured (see Table I), it is desirable to vary the passband of the filter 63 with the particular frequency range. In one embodiment of the filter 63, the signals from the balanced modulator 61 are introduced to each of four separate filters, 153, 155, 157 and 159 which are respectively connected in series with an associated gate 161, 163, 165 and 167. The outputs of these gates 161, 163, 165 and 167 are all to the conductor 26. The passband of the filters 153–159 must be of sufficient width to pass three times the highest frequency in the particular frequency range. This width is desirable to permit the passage of a measurement carrier associated with the third harmonic of the highest frequency in the range. For this reason, the filter 153 associated with the fourth frequency range has a passband of 3 MHz in this particular embodiment. Similarly, the filter 155 associated with the third frequency range, has a passband of 300 KHz. The filters 157 and 159, associated with the respective second and first frequency ranges have respective passbands of 30 KHz and 3 KHz.

Only one of the gates 161–167 is activated for a particular frequency range. The activated one of the gates 161–167 connects the associated one of the filters 153–159 between the balanced modulator 61 and the conductor 26. As noted, the gates 161–167 can be activated by the highlevel signals on the respective conductors 113–119.

Figure 7:
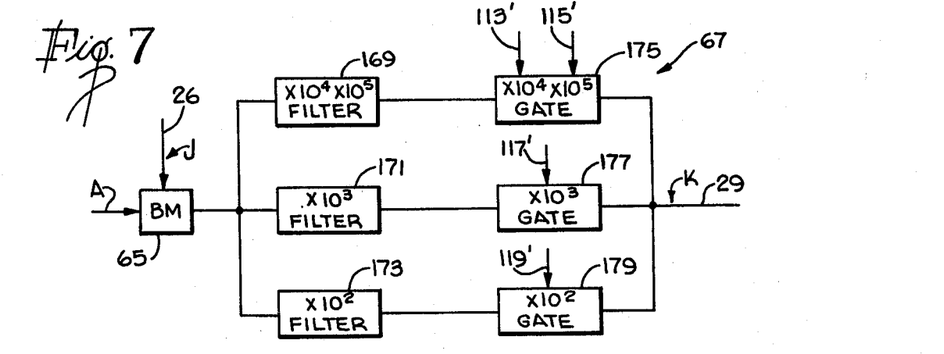
FIG. 7 is a block diagram of another of the low pass filters illustrated in FIG. 1.

The balanced modulator 65 and associated low pass filter 67 are illustrated in FIG. 7. The filter 67 is similar to the filter 63 illustrated in FIG. 6 in that it includes a plurality of filters 169, 171 and 173, each connected in series with a respective gate 175, 177 and 179. It is the purpose of the filter 67 to separate from those signals at the output of the balanced modulator 65 the specific output signal K having the frequency associated with the frequency range of the input signal. In one of the preferred embodiments, this frequency of the output signal is 5 Hz for the first frequency range, 50Hz for the second frequency range, and 500 Hz for both the third and fourth frequency ranges.

In order to maximize the energy transfer through the filter 67, it is desirable that its passband be approximately three times as wide as the maximum frequency to be passed. In one of the preferred embodiments, the frequency of the output signal K is 5 Hz for the first fequency range, 50 Hz for the second frequency range, and 500 for both the third and fourth frequency ranges. In this embodiment, the filter 169 is preferably provided with a passband of 1.5 KHz, the filter 171 is provided with a passband of 150 Hz, and the filter 173 is provided with a passband of 15 Hz. The gate 175 associated with the filter 169 can be activated by the high level range signals on the conductors 113' and 115'. Similarly the gates 177 and 179 associated with the respective filters 171 and 173 can be activated by the high level signals on the conductors 117' and 119', respectively.

It will be recalled that in another embodiment of the invention, the output signal K in the first and second frequency ranges has a frequency of 5 Hz, and in the third and fourth frequency ranges has a frequency of 50 Hz and 500 Hz, respectively. In such an embodiment, the gate 179 would be activated by signals on the conductors 117' and 119' while the gates 177 and 175 would be activated by signals on the conductors 115' and 113' respectively.

It will be recalled that in another embodiment of the invention, the output signal in the first and second frequency ranges had a frequency of 5 Hz, and in the third and fourth frequency ranges had a frequency of 50 and 500 Hz, respectively. In such an embodiment, the gate 179 would be activated by signals on the conductors 117' and 119' while the gates 177 and 175 would be activated by signals on the conductors 115' and 113', respectively.

It is desirable to provide the measurement carrier signal J on the conductor 26 with a very accurate and clean sine wave. This facilitates the demodulation of the input signal A so that the signals at the output of the balanced modulator 65 can be easily separated by the low pass filter 67. It is well known that a signal having a square wave, such as the signal G, can be balance modulated with a clean sinusoidal signal to produce a clean sine wave such as that desired for the measurement carrier signal J. For this reason, it is desirable that the modulating signal I, which is derived from the signal H, have a clean sinusoidal waveform. This can be accomplished with the filtered multi-decade divider network 59 illustrated in FIG. 8.

Figure 8:
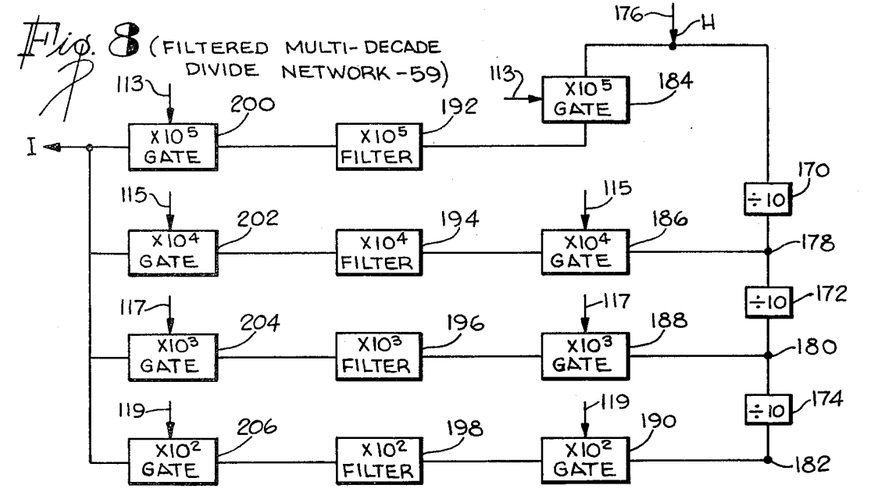
FIG. 8 is a block diagram of a filtered multi-decade divide network illustrated in FIG. 1.

It will be noted that this network 59 is similar to both the divide network illustrated in FIG. 5 and the low pass filter illustrated in FIG. 6. This particular network 59 introduces the signal H on a terminal 176 into a series of divide networks 170, 172 and 174. Each of the networks 170–174 divides the frequency of the signal at its respective input by a magnitude of ten. A plurality of terminals 178, 180 and 182 appear at the outputs of the respective networks 170–174. The signals on the terminals 176–182 are individually passed by respective gates 184–190 which are activated by the range signals on the respective conductors 113–119.

These gates 184–190 provide at their respective outputs digital or square wave signals. It is well known that such square wave signals are formed by sinusoidal signals including a signal having the fundamental frequency of the square wave and signals of diminishing magnitude having the harmonic frequencies. These square wave signals from the gates 184–190 are introduced to respective analogue filters 192, 194, 196 and 198. These filters 192–198 pass only the particular sinusoidal signal which has the fundamental frequency. These signals from the filters 192–198 are passed by respective analogue gates 200, 202, 204 and 206 which can be activated by the range signals on the respective conductors 113'–119'. The outputs of the gates 200–206 are combined to provide the clean sinusoidal signal I which is introduced to the balanced modulator 61.

The automatic signal analyzer 11 of the present invention provides a normalized input signal and also generates a measurement carrier signal for demodulating only the particular harmonic being measured. These features differ from those of a wave analyzer which functions as a frequency selective voltmeter to measure the absolute magnitude of any frequency in the passband. It will be recalled that in a wave analyzer it is desirable that the input signal not be normalized so that an absolute measurement of signal amplitude can be made. It is also desirable that the carrier frequency of the local oscillator be manually variable to demodulate the particular frequency being measured.

Figure 9:
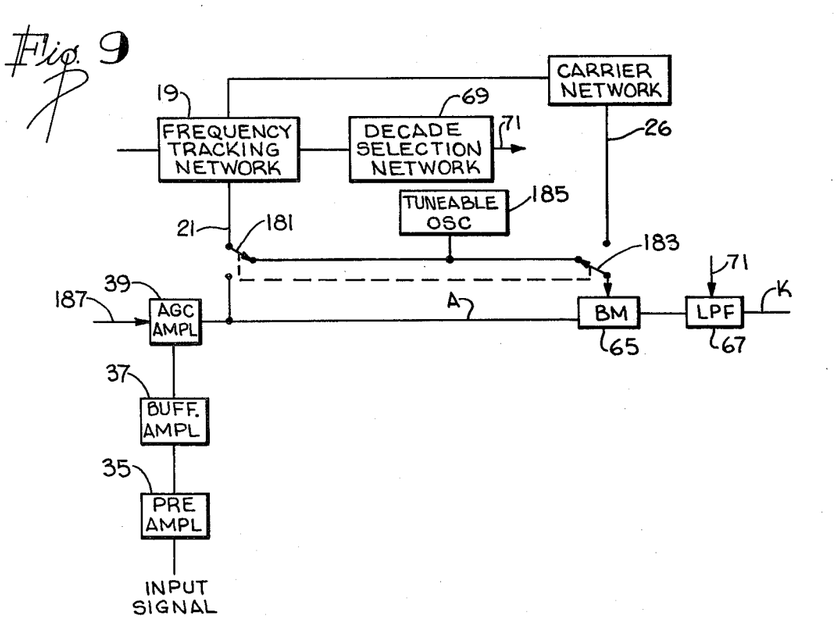
FIG. 9 is a block diagram illustrating how the analyzer of FIG. 1 can be modified to function as a wave analyzer.

Though the functions of the analyzer 11 and a normal wave analyzer differ, the analyzer 11 can be modified to function as a wave analyzer. As illustrated in FIG. 9, the conductors 21 and 26 can be opened by respective switches 181 and 183 and a tunable wide band oscillator 185 can provide a local carrier signal to both the frequency tracking network 19 and the balanced modulator 65. In addition, the automatic gain control feature of the amplifier 39 can be inhibited by a signal on a conductor 187 so that the input signal is no longer normalized.

In the balanced modulator 65, the input signal A, which will not be normalized in this embodiment, is demodulated by the carrier frequency provided by the oscillator 185. The magnitude of the output signal K can then be measured to provide an indication of the amplitude of any component in the signal A, the central frequency of which is equal to the frequency tuned by the oscillator 185.

The output signal of the oscillator 185 can also provide an input to the frequency tracking network 19 and therefore to the decade selection network 69. In the manner previously discussed, the network 69 will provide an indication on the conductors 71 of the particular frequency range which includes the fundamental frequency of the oscillator 185. These signals on the conductors 71 can be used to automatically vary the passband of the low pass filter 67. A preferred embodiment additionally includes means for manually varying this passband.

The analyzer 11 of the present invention provides a significant advance over the wave analyzers and distortion analyzers of the prior art. The analyzer 11 provides means for normalizing the amplitude of the input signal so that distortion can be accurately measured even with amplitude fluctuations in the input signal. The analyzer 11 of the present invention also automatically tracks the frequency of the input signal so that an appropriate measurement carrier can be generated to demodulate the particular harmonic to be measured. This feature can be implemented by a frequency tracking network which locks with the frequency of the input signal to provide an intermediate carrier signal having a frequency which varies in a known manner with the frequency of the input signal. In response to this particular signal, the carrier network 25 provides a measurement carrier signal which varies not only with the frequency of the input signal but also with the particular harmonic to be measured. This highly desirable measurement carrier can be used to demodulate the input signal so that the magnitude of the particular harmonic can be measured. This magnitude can be continuously measured even if the frequency of the input signal varies.

Of particular advantage to the analyzer 11 is the decade selection network 69 that determines which of a plurality of frequency ranges includes the fundamental frequency of the input signal. A signal having characteristics indicative of this determination can be used to control the characteristics of divide networks and of the passbands of low pass filters in the analyzer 11. The analyzer 11 is particularly adapted for conversion to function as a wave analyzer for measuring the relative amplitude of any frequency in its passband.

Although the invention has been described with reference to specific embodiments, it will be obvious to those skilled in the art that the invention can be otherwise embodied. Furthermore, even the preferred embodiments described can be slightly altered to provide the signals in the analyzer with frequencies other than those tabulated in Table I. For these reasons, the scope of the invention should be ascertained only with reference to the following claims.

We claim:

1. A signal analyzer for individually analyzing selected harmonics of an input signal, including means for generating first and second reference signals which differ from each other by a small offset frequency;

a first loop responsive to the input signal and the first reference signal for providing an intermediate carrier signal, the frequency of which is the sum of the frequencies of the first reference signal and the selected harmonic of the input signal; and a second loop including means for modulating the intermediate carrier signal with the second reference signal to provide a measurement carrier signal having a frequency equal to the difference between the frequencies of those signals and further including means for modulating the measurement carrier signal with the input signal to provide an output signal having characteristics indicative of the magnitude of the selected harmonic of the input signal.

2. The analyzer recited in claim 1 wherein the first loop includes means for manually selecting any of the fundamental and next two harmonics of the input signal.

3. The analyzer recited in claim 2 further including a low pass filter for isolating from said output signal a specific signal which is proportional to the magnitude of the selected harmonic of the input signal.

4. The analyzer recited in claim 3 further including means responsive to the specific signal emanating from the low pass filter for providing visual indications of the magnitudes of individual harmonics of the input signal as percentages of the magnitude of the fundamental harmonic of the input signal.

5. The analyzer recited in claim 1 wherein the first loop includes
- a modulator for modulating the intermediate carrier signal with said first reference signal;
- a low pass filter for passing only the difference frequency generated at the modulator; and
- a divide network for maintaining said difference frequency above a frequency exceeding 10 KHz.

6. The analyzer recited in claim 5 further including means in association with the second loop for dividing each of the intermediate carrier signal and the second reference signal equally to the division of said difference frequency by said divide network.

7. The analyzer recited in claim 6 wherein said divide networks are decade divide networks and the analyzer further includes a decade selection network for sensing that decade which includes the fundamental frequency of the input signal in order to provide tenfold increases in the frequency of said specific signal.

8. A signal analyzer for individually analyzing selected harmonics of an input signal, including:
- means for generating first and second reference signals which differ from each other by a small offset frequency;
- a first loop including sequentially
  - a voltage controlled oscillator for producing an intermediate carrier signal of initially variable frequency,
  - a first balanced modulator for producing a signal having frequencies equal to the sum and difference of frequencies of the first reference signal and the intermediate carrier signal,
  - a low pass filter for passing only said difference frequency,
  - a fundamental/harmonic selection network for dividing the difference frequency by an integer representative of the selected harmonic of the input signal to provide a feedback signal, and
  - a phase detector for locking the frequency of said intermediate carrier signal when the feedback signal and the input signal have the same frequency;
- a second loop including sequentially
  - a second balanced modulator for producing a signal having frequencies equal to the sum and difference of the second reference signal and the intermediate carrier signal,
  - a low pass filter for passing only said difference frequency as a measurement carrier signal,
  - a third balanced modulator for producing an output signal having frequencies equal to the sums and differences of the measurement carrier signal and individual harmonics of the input signal; and
- a low pass filter for receiving said output signal and passing only the smallest difference frequency as a specific output signal having characteristics indicative of the magnitude of the harmonic of the input signal selected by said selection network.

9. The analyzer recited in claim 8 further including
- a first divide network connected to the selection network in the first loop;
- second and third divide networks each connected to an input of the second balanced modulator; and
- means for selecting a common divider for each said divide network to increase the frequency of said specific output signal.

10. The analyzer recited in claim 8 wherein each divide network is a decade divide network and the analyzer further includes a decade selection network for sensing that decade which includes the fundamental frequency of the input signal in order to provide tenfold increases in the frequency of said specific signal.

11. The analyzer recited in claim 1 further including means enabling the analyzer to function as a wave analyzer including:
- a tunable oscillator for generating a local carrier signal having the central frequency of the component of the input signal to be analyzed;
- means for isolating the two modulating means of the second loop from each other and for connecting the tunable oscillator to the second-mentioned modulating means to modulate the local carrier signal with the input signal to provide an output signal including frequencies equal to sums and differences of the frequencies of the local carrier signal and components of the input signal; and
- a low pass filter for receiving said output signal and for passing a specific signal consisting of such difference frequencies as correspond to the component of the input signal to be analyzed, the magnitude of said specific signal representing the magnitude of said component.

12. The analyzer recited in claim 11 further including:
- a decade selection network for sensing the decade which includes the frequency of the local carrier signal and
- means for connecting the decade selection network to said low pass filter to provide tenfold increases in the frequency range of said specific signal.

13. The analyzer recited in claim 12 wherein said decade selection network is connected to the first loop and the analyzer includes means for isolating the input signal from the first loop and for applying said local carrier signal to the decade selection network.

14. A method of analyzing an input signal to determine the relative amplitude characteristic of its fundamental and individual harmonics including the steps of:
selecting one of the harmonics of the input signal for analysis;
generating first and second reference signals which differ from each other by a small offset frequency;
producing an intermediate carrier signal having a frequency equal to the sum of the frequencies of the first reference signal and the selected harmonic of the input signal;
modulating the intermediate carrier signal with the second reference signal to provide a measurement carrier signal having a frequency equal to the difference between the frequencies of the second reference signal and the intermediate carrier signal; and
modulating the input signal with the measurement carrier signal to provide an output signal including a specific signal having a frequency equal to the difference between the frequencies of the measurement carrier signal and said selected harmonic of the input signal.

15. A method as recited in claim 14 including the further step of:
filtering the output signal to isolate said specific output signal which has characteristics representative of the magnitude of said selected harmonic of the input signal.

16. A method as recited in claim 15 wherein the step of producing an intermediate carrier signal includes the steps of:
producing an intermediate carrier signal of initially viariable frequency;
modulating the first reference signal with the intermediate carrier signal to produce a signal having a frequency equal to the difference between the frequencies of the intermediate carrier signal and the first reference signal;
dividing the frequency of said difference signal by an integer representative of the selected harmonic of the input signal to provide a feedback signal;
comparing the frequencies of the feedback signal and the input signal; and
locking the frequency of the intermediate carrier signal when said compared frequencies are equal.

17. A method as recited in claim 16 including the further steps of:
dividing equally the frequency of each of said feedback signal, the second reference signal and the locked intermediate carrier signal to provide an increased difference between the frequencies of the locked intermediate carrier signal and the first reference signal when the frequency of the input signal is relatively low.

\* \* \* \* \*